United States Patent
Chritz

(10) Patent No.: US 8,068,348 B2
(45) Date of Patent: Nov. 29, 2011

(54) ELECTRICAL POWER DISTRIBUTION UNIT AND ELECTRICAL PUNCHED GRID THEREFOR

(75) Inventor: Gunther Chritz, Birkenau (DE)

(73) Assignee: Tyco Electronics AMP GmbH, Bensheim (DE)

( * ) Notice: Subject to any disclaimer, the term of this patent is extended or adjusted under 35 U.S.C. 154(b) by 553 days.

(21) Appl. No.: 12/279,460

(22) PCT Filed: Feb. 3, 2007

(86) PCT No.: PCT/EP2007/000934
§ 371 (c)(1),
(2), (4) Date: Aug. 14, 2008

(87) PCT Pub. No.: WO2007/093294
PCT Pub. Date: Aug. 23, 2007

(65) Prior Publication Data
US 2009/0016035 A1    Jan. 15, 2009

(30) Foreign Application Priority Data
Feb. 15, 2006  (DE) .......................... 10 2006 006 846

(51) Int. Cl.
*H01R 12/16* (2006.01)
(52) U.S. Cl. ........ 361/785; 361/714; 361/758; 361/816; 174/255; 174/260; 174/266; 174/362; 257/88; 257/687
(58) Field of Classification Search .................. 361/785, 361/714, 758, 816; 174/255, 260, 266, 362; 257/88, 697
See application file for complete search history.

(56) References Cited

U.S. PATENT DOCUMENTS

| | | | | |
|---|---|---|---|---|
| 3,621,444 A * | 11/1971 | Stein | ............................. | 439/109 |
| 3,860,778 A * | 1/1975 | Rudd et al. | ..................... | 219/67 |
| 4,620,632 A * | 11/1986 | Alemanni | ..................... | 206/724 |
| 4,747,019 A * | 5/1988 | Ito et al. | ......................... | 361/816 |
| 4,765,600 A * | 8/1988 | Hartel | ............................ | 267/122 |
| 4,952,829 A * | 8/1990 | Armbruster et al. | ........ | 310/68 D |
| 5,113,310 A * | 5/1992 | Kuroki et al. | ................. | 361/302 |
| 5,118,903 A * | 6/1992 | Schupp et al. | ................. | 174/16.3 |
| 5,874,920 A * | 2/1999 | Araki et al. | ..................... | 343/702 |
| 6,842,345 B2 * | 1/2005 | Barsun et al. | ................. | 361/758 |
| 6,936,855 B1 * | 8/2005 | Harrah | ............................ | 257/88 |

(Continued)

FOREIGN PATENT DOCUMENTS
DE      10147400 A1    3/2003

(Continued)

*Primary Examiner* — Xiaoliang Chen
(74) *Attorney, Agent, or Firm* — Barley Snyder

(57) ABSTRACT

An electrical power distribution unit (1) for an electrical system has a printed circuit board (200) with a punched grid (100) arranged thereon. An electrical component (300, 310) is arranged on the printed circuit board on a side of the punched grid (100). An electrical contact (350) of the electrical component projects through a passage opening in the printed circuit board. The punched grid is arranged between the electrical component and the printed circuit board, and an opening is formed in the punched grid in an area (130) around the electrical contact. The punched grid has a current infeed (110) which comprises a plurality of tongues (111, 112; 113). At least one of the tongues is bendable out of a plane of the punched grid in such a way that two of the tongues form a mutually adjacent common portion (115), which is electrically contactable by an electrical plug connector.

15 Claims, 8 Drawing Sheets

U.S. PATENT DOCUMENTS

| | | |
|---|---|---|
| 7,153,605 B2 * | 12/2006 | Horiguchi et al. ............ 429/437 |
| 2002/0009630 A1 * | 1/2002 | Gao et al. ........................ 429/34 |
| 2002/0195262 A1 * | 12/2002 | Kirchberger et al. ........ 174/52.1 |
| 2003/0038701 A1 * | 2/2003 | Wang ............................... 337/59 |
| 2003/0039107 A1 * | 2/2003 | Modi ............................. 361/752 |
| 2005/0079747 A1 * | 4/2005 | Chritz et al. .................... 439/81 |
| 2006/0012026 A1 * | 1/2006 | Kang et al. .................... 257/697 |
| 2006/0145872 A1 * | 7/2006 | Tanaka et al. .............. 340/572.8 |

FOREIGN PATENT DOCUMENTS

| | | |
|---|---|---|
| DE | 10329650 A1 | 1/2004 |
| EP | 0312415 A1 | 4/1989 |

* cited by examiner

ELECTRICAL POWER DISTRIBUTION UNIT AND ELECTRICAL PUNCHED GRID THEREFOR

CROSS-REFERENCE TO RELATED APPLICATIONS

This application claims the benefit of the earlier filed International Patent Application No. PCT/EP2007/000934 having a filing date of Feb. 3, 2007, and that claims the benefit of the earlier filed German Patent Application No. DE 10 2006 846.7 having a filing date of Feb. 15, 2006.

The invention relates to an electrical power distribution unit for an electrical system, in particular a central electrical system of a motor vehicle, and an electrical punched grid for supplying current to a printed circuit board of such an electrical power distribution unit.

BACKGROUND

Power distribution units are used in particular in motor vehicles to distribute high electrical currents and are constituents, for example, of so-called central electrical systems. In the electrical systems of motor vehicles, central electrical systems constitute the interfaces between electrical or electronic control devices and electrical lines or line strands. The central electrical system substantially fulfils a distributor function, supplying electrical consumer units of the motor vehicle, such as for example antilock braking systems (ABS), electrical stability programs (ESP), windscreen wipers, indicators and the like, with electrical current or electrical voltage via electrical lines or wiring harnesses and monitoring the serviceability of these consumer units. The electrical consumer units are actuated by means of switching devices, which are arranged in pluggable manner in the central electrical system together with fuses of the consumer unit electrical circuits. In addition, central electrical systems may comprise slots for switches, resistors, relays, solder contacts, pins, tabs and the like, together with connection possibilities for wiring harnesses provided with electrical coupling members.

DE 10 2004 006 575 A1 discloses a power distribution unit exclusively using punched grid technology for a motor vehicle. After being punched out of sheet metal, the punched grid comprises a plurality of conductor track portions connected by connecting webs, into which conductor track portions holes have been punched on production of the punched grid, wherein press-fit contacts may be inserted into these holes. After the punching process, the punched grid is partially encapsulated by plastics injection molding and then the connecting webs between the conductor track portions are separated, in order to produce electrically separate areas on the punched grid. Then, the press-fit contacts are press-fitted into the holes in the conductor track portions.

In view of the disadvantageous nature of electrical power distribution units produced exclusively by punched grid technology (large structure, heavy weight) especially in the automotive sector, electrical power distribution units using printed circuit board technology are preferred.

Power distribution units using printed circuit board technology and the punched grids therefor are exposed to severe thermal loading due to the comparatively long current transport paths on the printed circuit board and sometimes narrow current transport paths on the punched grid. The reason for this is the comparatively large openings within the punched grid. In addition, this makes the punched grid unstable and the punched grid may rapidly suffer damage as a result.

With regard to the prior art relating to punched grids and electrical power distribution units, see also the explanations relating to FIGS. 1-3 of the drawings.

It is, therefore, an object of the invention to provide an improved electrical power distribution unit with an improved punched grid, wherein it is intended for the electrical power distribution unit to display improved thermal behavior and for the punched grid to be less susceptible to damage. Furthermore, it is intended that the electrical power distribution unit or the electrical punched grid should be cheaper to produce.

SUMMARY

The invention provides an electrical power distribution unit for an electrical system, in particular a central electrical system of a motor vehicle, the power distribution unit comprising a printed circuit board and a punched grid arranged on the printed circuit board, and an opening for an electrical component, which is arranged on the printed circuit board on the side of the punched grid, being formed in the punched grid in the area of at least one electrical contact of the electrical component in such a way that an area of the punched grid is arranged between the electrical component and the printed circuit board.

It goes without saying that the openings in the punched grid for the contacts of the electrical components are so dimensioned that the punched grid cannot electrically contact these electrical contacts. According to the invention, it is therefore possible to arrange the electrical components directly on the punched grid, and thereby to bring the punched grid pins for supplying the printed circuit board with current or for supplying the respective electrical component with current as close as possible to the electrical component itself. This has a series of advantages according to the invention.

In comparison with the prior art, the punched grid itself takes up more surface area overall (for the same external dimensions), so resulting in an increased current carrying capacity and thereby less heating of the punched grid and also of the printed circuit board due to larger material cross-sections or material accumulations. On the other hand, the printed circuit board or the conductor tracks thereof has/have to transport the sometimes high electrical currents supplied by the punched grid over only very short distances due to the punched grid pins being moved very close to the current supply of the corresponding electrical component, such that for this reason too the printed circuit board itself is no longer as severely heated as in the prior art.

Since the punched grid pins are provided after punching out of the punched grid directly adjacent those portions in the punched grid which may be provided between the electrical component and the printed circuit board, the punched grid pins are protected within the punched grid structure between these portions and can therefore no longer be damaged on handling of the punched grid. The portions of the punched grid protecting the punched grid pins are of larger or more solid design (in the punched grid plane) than the punched grid pins, such that they cannot be so easily damaged as the punched grid pins themselves.

In addition, an overall more rigid punched grid is obtained, since it has more material distributed over the base surface thereof. Furthermore, in the case of the punched grid according to the invention, a large number of filigree structures are omitted compared to the prior art, such that the punched grid exhibits improved cohesion even in the case of small thicknesses (see below) and cannot be so quickly damaged.

In an embodiment of the invention, the punched grid pins for supplying current to the printed circuit board or the electrical component are provided in such a way, in the vicinity of that portion of the punched grid which is located between the electrical component and the printed circuit board, that the punched grid pins are provided in the immediate vicinity of a boundary of the component or below the component. The punched grid pins may be located as close as possible to the electrical contacts to be contacted of the electrical component.

Due to an increased current carrying capacity resulting from the larger material cross-sections, improved handling of the punched grid due to protection of the punched grid pins and an overall more stable punched grid, the punched grid may be of thinner construction, thereby reducing the cost thereof and thus also of the electrical power distribution unit.

Punched grids according to the prior art are 0.8 mm thick for automotive applications. According to the invention, it is now possible to make the punched grid thinner than 0.8 mm. So that the punched grid may be contacted, as before, by a tab according to the prior art, it is sensible for the thickness of the punched grid to be dimensioned in accordance with an integral factor of 0.8 mm, and for an appropriate number of punched grids to be laid against one another in the area of the current supply tab to be contacted electrically, so as to produce a thickness of 0.8 mm.

The object of making a punched grid which takes up more surface area, due to the portions of the punched grid provided between the electrical components and the printed circuit board, more cheaply by reducing its thickness is achieved by means of an electrical punched grid for supplying current to a printed circuit board of an electrical power distribution unit, wherein the current infeed for the punched grid comprises a plurality of tongues which may be bent out of a plane of the punched grid, and a respective plan view of a tongue is such that in each case two tongues, bendable towards one another, form a common portion between them which may be encompassed by an electrical plug connector, in particular a tab, and thus the punched grid may be electrically contacted.

In this way, a punched grid of thinner design according to the invention may be electrically contacted as before by a tab according to the prior art. It is merely necessary to position an appropriate number of portions of the punched grid next to one another, so as to form an area on the punched grid which corresponds in its external diameter to the internal diameter of a tab.

In an embodiment of the invention, two U-shaped tongues, bendable towards one another, are provided, wherein, when bent towards one another, one branch of the first U-shaped tongue is congruent with a branch of the other U-shaped tongue and the remaining two branches do not adjoin one another. Thus, the current infeed has an M-shaped appearance in side view. The internal diameter of the tab is thus filled by the two adjoining branches of the U-shaped tongues. An internal dimension of the tab at a 90 degree angle thereto is accordingly preferably bridged completely by the two webs of the U-shaped tongues, such that the current supply tab may be seated firmly and non-rotatably in two axial directions on the current infeed.

In addition, the object of the invention may be achieved by an electrical punched grid for supplying current to a printed circuit board of an electrical power distribution unit, wherein the punched grid comprises a current infeed protruding out of a plane thereof, and an area of the current infeed accessible by a tab for supplying electrical current to the punched grid is folded over on itself one or more times.

In a simple embodiment of the invention, this current infeed is rectangular in plan view (current infeed in the unfolded state), said rectangle being folded over on itself in places. The rectangle is preferably folded once, so as to form the area of the current infeed accessible to the tab. Then, or beforehand, the current infeed is raised up straight, such that it may be contacted electrically by the tab.

To stiffen such a current infeed, the current infeed folded over on itself may comprise a supporting portion, which is located in plan view at a free end of the current infeed. When the current infeed is in the folded state, this supporting portion then projects downwards (i.e. at the outer end of the current infeed contactable by the tab) from the current infeed and is preferably supported in the plane of the punched grid.

It should be noted that the solutions to the problem may be provided separately from one another in an electrical power distribution unit or an electrical punched grid.

In addition, the invention relates to an electrical system with an electrical power distribution unit according to the invention or an electrical system with an electrical punched grid according to the invention.

Additional embodiments of the invention are revealed by the other dependent claims.

BRIEF DESCRIPTION OF THE DRAWING

The invention is explained in greater detail below by means of exemplary embodiments and with reference to the attached drawings, in which.

DETAILED DESCRIPTION OF THE EMBODIMENT(S)

The invention is explained below with reference to figures illustrating the invention relating to so-called hybrid applications, i.e. printed circuit boards printed or equipped on one side having a punched grid remote from the one side arranged on the printed circuit board. However, it is not intended for the invention to be restricted to such hybrid applications, but rather to relate generally to power distribution units and punched grids.

Figure 1:
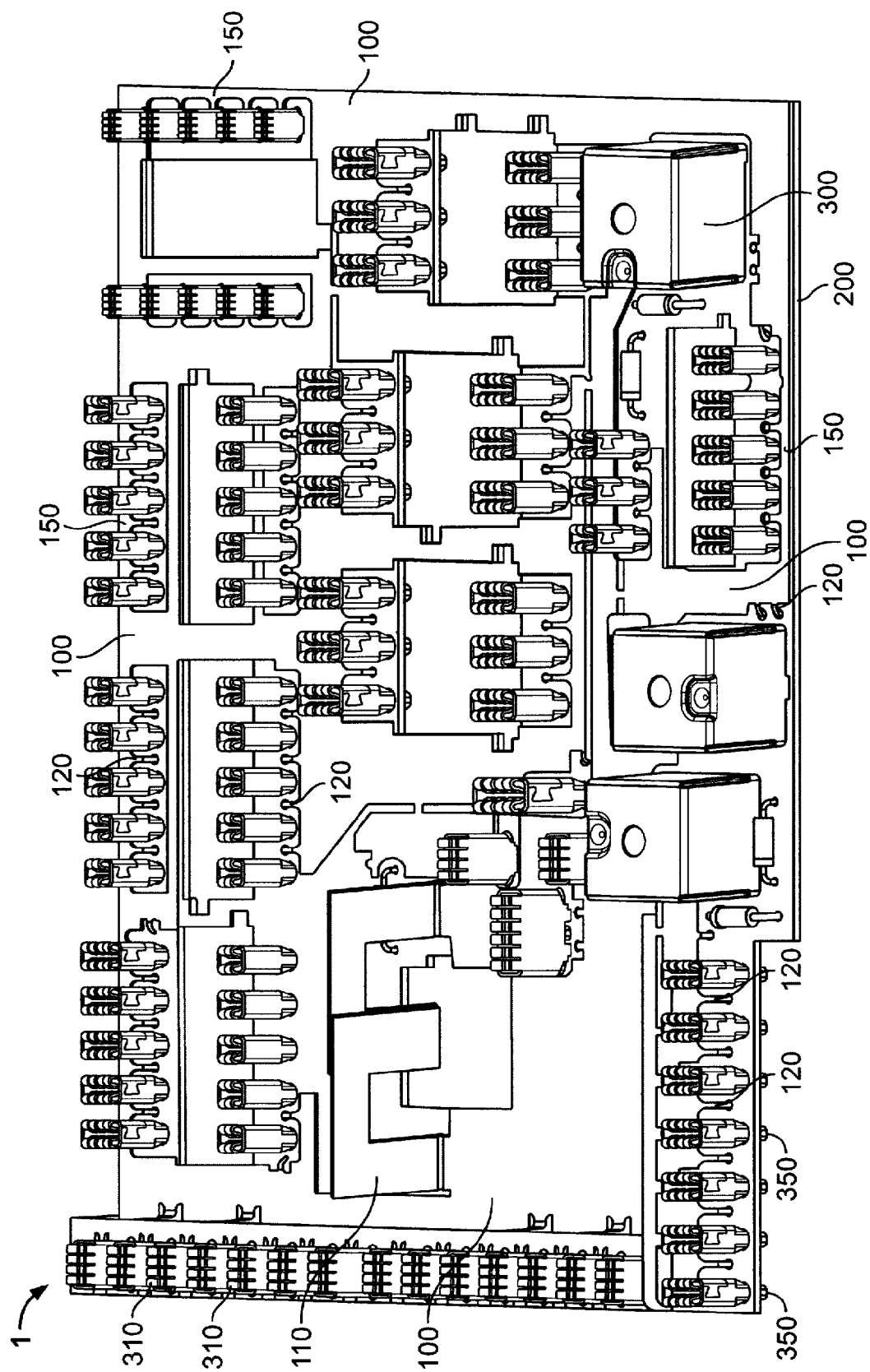
FIG. 1 is a three-dimensional representation of an electrical power distribution unit according to the prior art viewed obliquely from above and comprising a printed circuit board, a punched grid and a plurality of electrical components.

FIG. 1 shows an electrical power distribution unit 1 for an electrical system of a motor vehicle. The electrical power distribution unit 1 substantially comprises a printed circuit board 200, a punched grid 100 and a plurality of electrical components 300, 310. The punched grid 100 lies flat on the printed circuit board 200 and is arranged on a side of the printed circuit board 200 which is remote from conductor tracks or printed circuit board pads of the printed circuit board 200. The punched grid 100 supplies electrical current to the printed circuit board 200 or the conductor tracks/printed circuit board pads thereof via punched grid pins 120, which extend through the printed circuit board 200. The punched grid pins 120 protrude from the printed circuit board 200 on a side opposite from the punched grid 100 and are soldered together with the printed circuit board 200 or the appropriate conductor tracks/printed circuit board pads. Below, only the conductor tracks of the printed circuit board 200 are mentioned, but the conductor tracks should be understood to include the printed circuit board pads.

The punched grid 100 is removed completely in an area of the electrical components 300, 310. The openings formed are spaced from the respective outer boundary (plan view) of the electrical components 300, 310, such that the electrical components 300, 310 are seated directly on the printed circuit board 200. Electrical contacts 350 of the electrical components 300, 310 extend through the printed circuit board 200 and contact the latter electrically on the opposite side by way of the conductor tracks. The electrical contacts 350 are soldered together with the printed circuit board 200 or the conductor tracks. The punched grid 100 thus covers the printed circuit board 200 only at those points at which none of the electrical components 300, 310 are provided on the punched grid side.

The electrical components 300 are, for example, electronic modules or solder relays designed as power relays 300. The electrical components 310 are, for example, solder contacts, pins, tabs, fuses, switches, resistors, and the like. The electrical components 300, 310 are seated directly on the printed circuit board 200, which forms a limit stop for the corresponding electrical component 300, 310.

The punched grid 100 of the power distribution unit 1 comprises a current infeed 110, which takes the form of a tongue and projects at right angles from the punched grid 100. The tongue-shaped current infeed 110 is integral with the punched grid 100 and is simply bent out of a plane of the punched grid 100 after punching of the punched grid 100 and may be electrically contacted by a tab. The tab has internal dimensions which correspond to external dimensions of the current infeed 110. The current infeed 110 is in one piece with the punched grid 100 at one end and, in the example illustrated, is M-shaped in side view. The two outer branches of the M-shaped current infeed 110 are constructed with their respective free ends in one piece with the punched grid 100.

Figure 2:
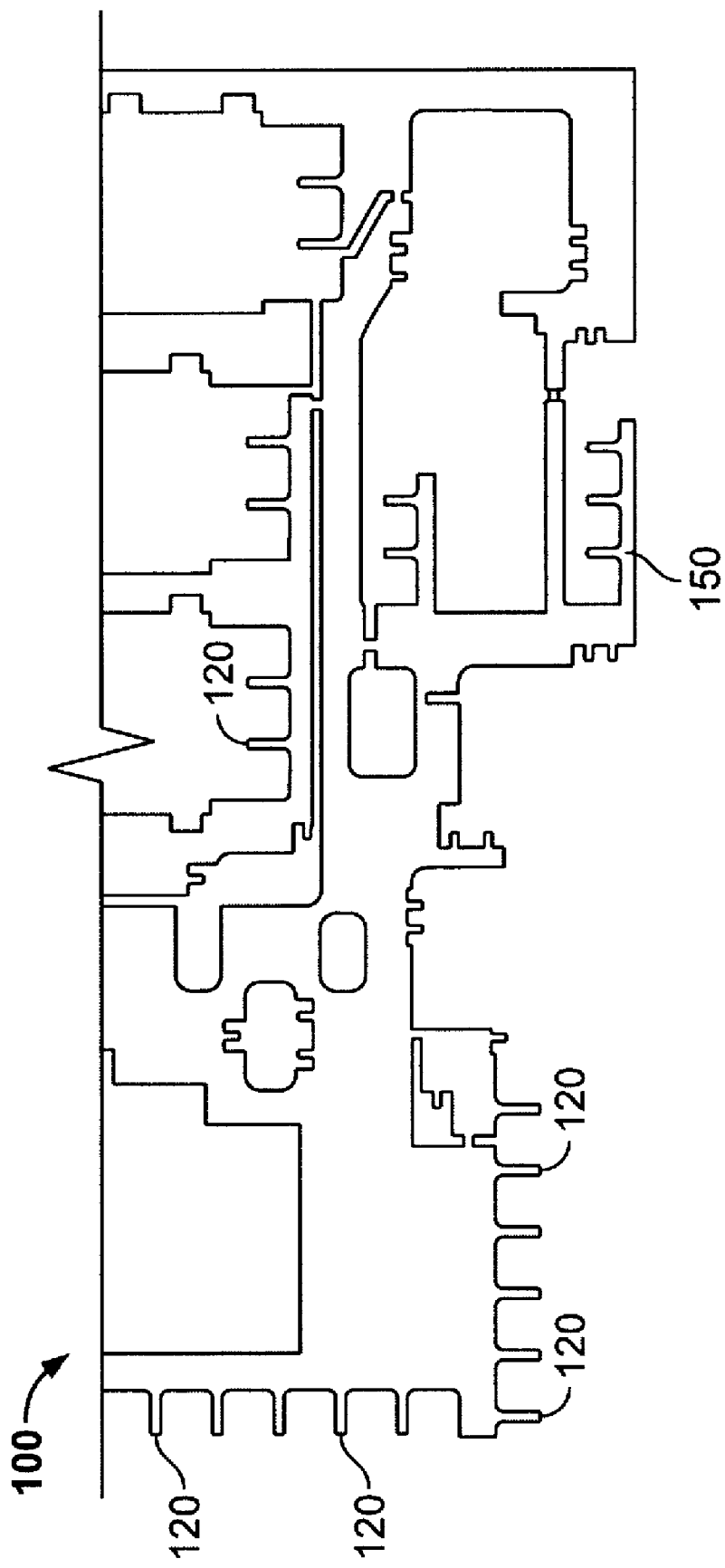
FIG. 2 shows a portion of a plan view of a punched grid according to the prior art.

FIG. 2 shows a punched grid 100 according to the prior art after it has been punched out of a metal sheet. The punched grid 100 according to FIG. 2 differs from the punched grid 100 according to FIG. 1. The punched grid 100 according to FIG. 2 is made from a 0.8 mm thick copper or brass sheet. The punched grid pins 120 for supplying current to the printed circuit board 200, which project freely from the punched grid 100, are clearly visible. In addition, the openings for the electrical components 300, 310 are clearly visible in the punched grid 100.

The punched grid 100 comprises a plurality of the punched grid pins 120 which protrude freely outwards from the punched grid 100. These externally freely accessible filigree punched grid pins 120 may rapidly become damaged if the punched grid 100 is handled improperly, since they occupy an exposed position on the punched grid 100. The position of the punched grid pins 120 in the punched grid 100 cannot be varied, since otherwise a current path on the printed circuit board 200 for the corresponding electrical component 300, 310 becomes too long. The printed circuit board 200 would then have to transport high electrical currents over comparatively long distances, which would cause it to heat up excessively since the conductor tracks of the printed circuit board 200 transporting the electrical current comprise only a small material cross-section.

In addition, both FIGS. 1 and 2 show portions 150 of the punched grid 100 in which current-carrying passages of the punched grid 100 are very narrow and thus are thermally severely loaded when properly used. There are structural reasons for this, since the punched grid 100 has wide openings formed in it in the area of the electrical components 300, 310.

Figure 3:
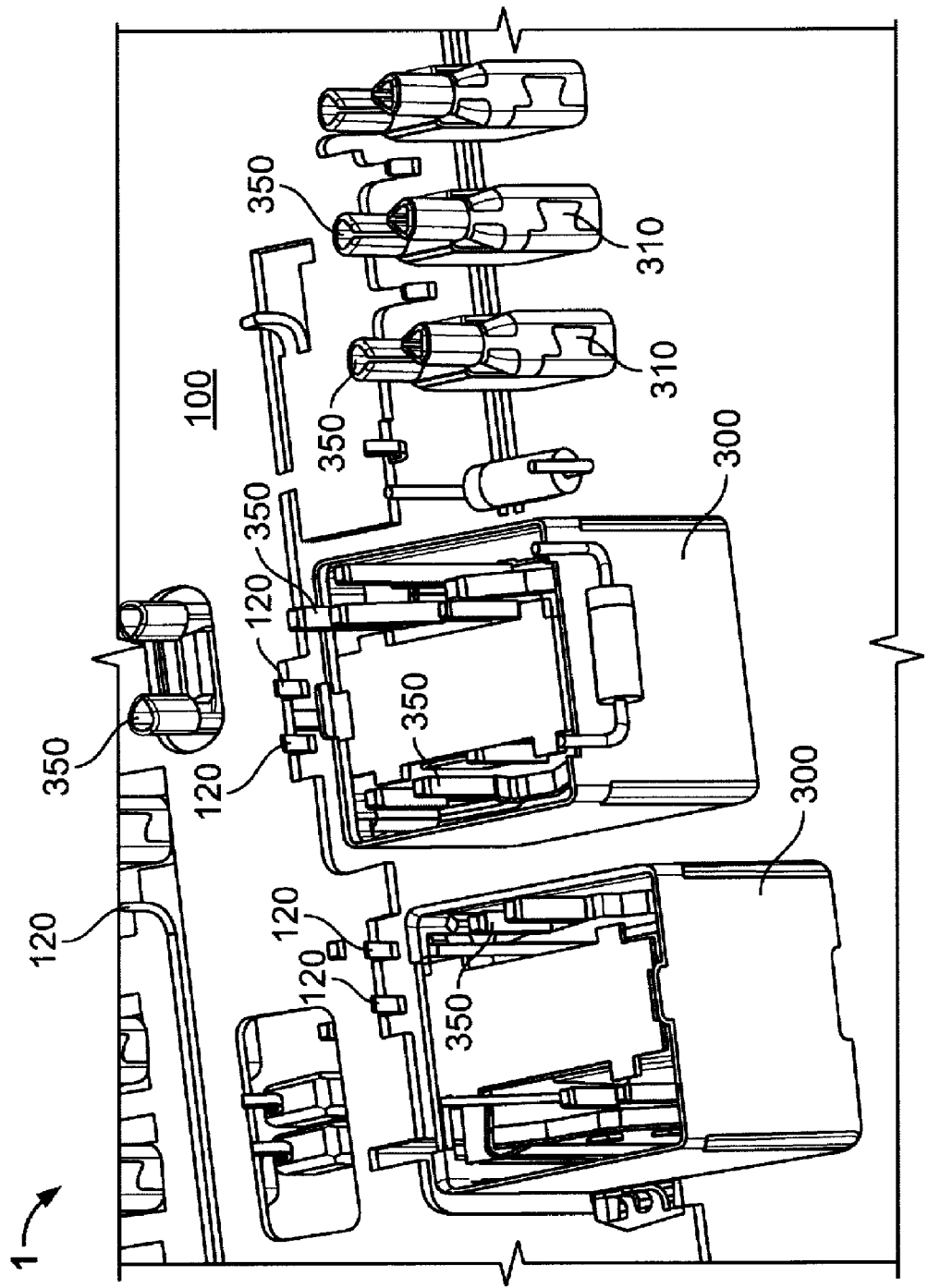
FIG. 3 is a three-dimensional representation of part of the electrical power distribution unit of FIG. 1 viewed obliquely from below, the printed circuit board being omitted.
Figure 4:
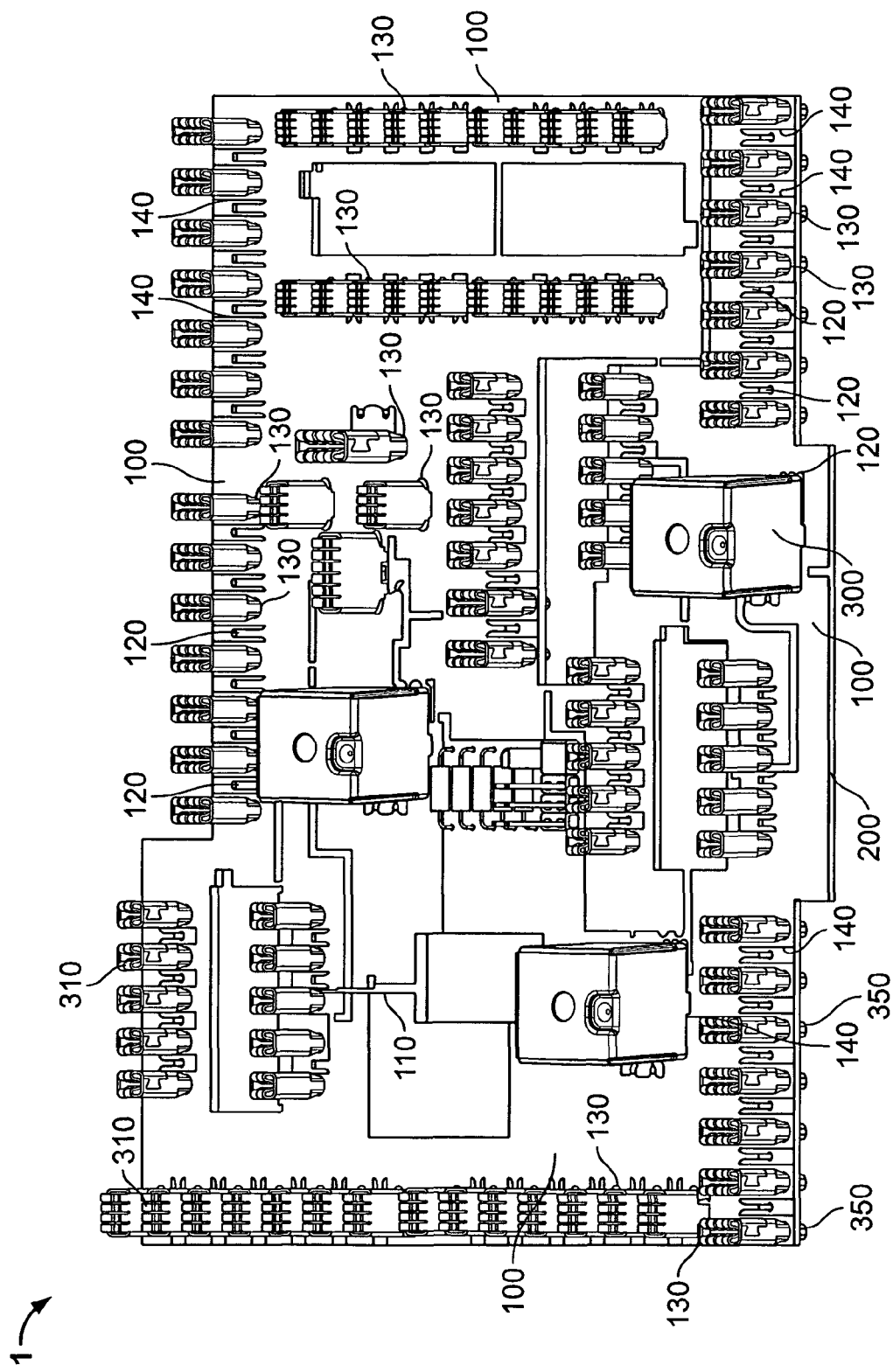
FIG. 4 is a three-dimensional representation of an electrical power distribution unit according to the invention viewed obliquely from above, comprising a printed circuit board, a punched grid and a plurality of electrical components.

FIG. 3 is a view from below of an electrical power distribution unit 1 with the electrical components fitted 300, 310, the printed circuit board 200 not being illustrated. The punched grid 100 with the openings formed in it in the area of the electrical components 300, 310 and the punched grid pins 120 extending through the printed circuit board 200 are clearly visible. The punched grid pins 120, for example, adjacent to the two electrical components 300 in the form of solder relays supply the latter with electrical current. Current thus flows from the punched grid pins 120 via conductor tracks of the printed circuit board 200 to electrical contacts 350 of the electrical components 300. The distance to be bridged by the conductor tracks between the punched grid pins 120 and the electrical contacts of the electrical components 300 is comparatively long, since high electrical currents have to flow thereover, for example, in the case of a power relay for an ABS system in the case of ABS control. This heats up the printed circuit board 200 severely in the corresponding area. In addition, the punched grid 100 is restricted in the amount of surface area it may occupy due to the openings for the electrical components 300, 310, such that it may likewise heat up severely when the electrical power distribution unit 1 is in operation, inter alia in the portions 150.

FIGS. 4-10 now show an electrical power distribution unit 1 according to the invention, wherein a punched grid 100 according to the invention has in part a different structure from the prior art. The punched grid 100 according to the invention is illustrated on its own in FIG. 5.

According to the invention, openings are no longer formed in the punched grid 100 in the area of the electrical components 300, 310, but rather only in the area of the electrical contacts 350 of the electrical components 300, 310. These openings 130 for the electrical contacts 350 of the electrical components 300, 310 are so dimensioned that the punched grid 100 cannot contact the respective electrical contact 350 electrically via the boundary of the respective opening 130. In a portion between the electrical component 300, 310 and the printed circuit board 200, an area 140 of the punched grid 100 extends according to the invention. Preferably, the area 140 extends through and under the electrical component 300, 310, i.e. between the printed circuit board 200 and the electrical component 300, 310. This is most clearly visible in FIG. 5, in which the areas 140 extending between two directly adjacent openings 130 are illustrated. However, it is also possible for the area 140 not to project through completely under the electrical component 300, 310.

Figure 6:
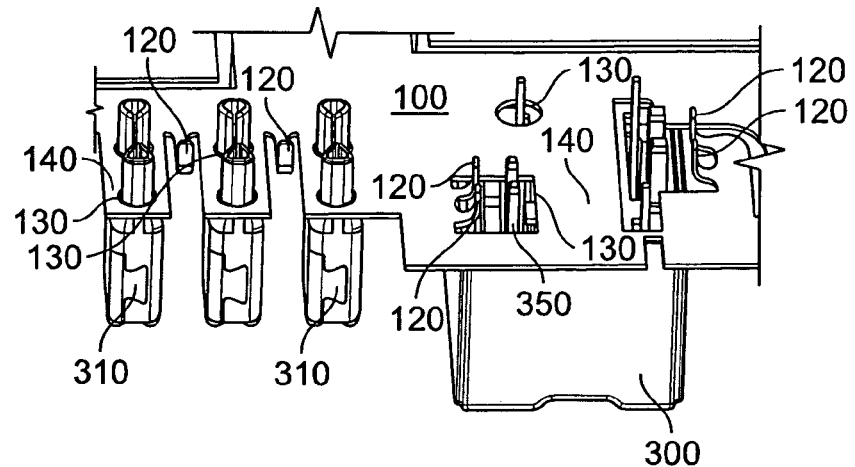
FIG. 6 is a three-dimensional representation of part of the electrical power distribution unit according to the invention of FIG. 4 viewed from below, the printed circuit board being omitted.
Figure 7:
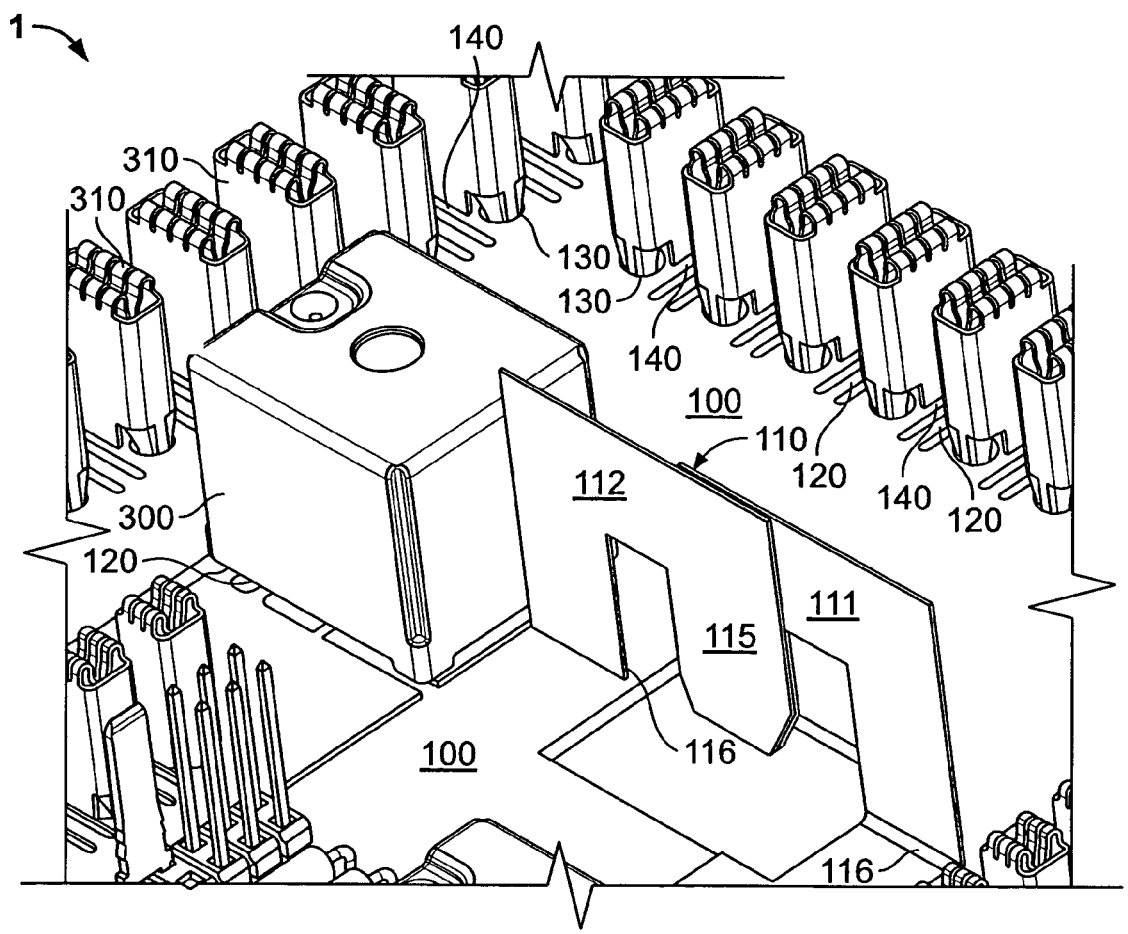
FIG. 7 is a three-dimensional representation of the electrical power distribution unit of FIG. 4 viewed sideways from above in an area of a current infeed of the punched grid according to the invention.

According to the invention, the electrical components 300, 310 are now no longer arranged directly seated on the printed circuit board 200 but rather on the punched grid 100, this being clearly visible in FIG. 6, which is a view from below of the electrical power distribution unit 1 according to the invention, the printed circuit board 200 being omitted.

The area 140 of the punched grid 100, which is located between the electrical component 300, 310 and the printed circuit board 200, is preferably so designed that the openings 130 are only formed in the punched grid 100 in a narrow area around the respective electrical contacts 350. For instance, it is preferable for the free portion between the electrical contact 350 and the punched grid 100, i.e. between the electrical contact 350 and the boundary of the opening 130, to amount to around 0.1 mm-1.0 mm, preferably 0.2 mm-0.7 mm. The entire opening 130 then has a diameter of 0.3 mm-2.5 mm, preferably 0.7-1.2 mm. One of the openings 130 is then provided for each of the electrical contacts 350.

The area 140 between the electrical component 300, 310 and the printed circuit board 200 preferably extends from one side of the electrical component 300, 310 through and under the electrical component 300, 310 to the parallel opposite side. This is preferably also the case for the two sides arranged at a 90 degree angle thereto. However, it is also possible for the area 140 only to extend beneath the electrical component 300, 310 from one side of the electrical component 300, 310 to a side of the electrical component 300, 310 arranged at a 90 degree angle thereto.

Preferably, the openings 130 are arranged wholly between the electrical component 300, 310 and the printed circuit board 200 and are not visible or are only barely visible when the power distribution unit 1 is in an assembled state. It is also preferable for the openings 130 to lie within a plan view of the electrical component 300, 310 projected onto the punched grid 100.

According to the invention, it is possible for the electrical currents flowing over the printed circuit board 200 to flow over the printed circuit board 200 over a shorter distance. This is most clearly visible from the bottom view of FIG. 6. In the case in particular of high electrical currents, which may be the case for example when the electrical components 300 are power relays, it is possible according to the invention for the path over which the current has to travel on the conductor tracks to pass only over short distances over the conductor tracks. This is achieved according to the invention by moving the punched grid pins 120 and the electrical contacts 350 of the electrical components 300, 310 as close as possible together.

In addition, it is possible according to the invention, for example, for the punched grid pins 120 to be inserted into the electrical printed circuit board 200 in an area of an external boundary of the electrical component 300, 310 (see FIG. 7) and to contact the corresponding conductor track electrically on the other side. In addition, it is possible according to the invention for the punched grid pins 120 to be arranged under the electrical component 300, 310, i.e. between the electrical component 300, 310 and the printed circuit board 200. In this way, the high electrical currents have, according to the invention, only to be transported over a very short distance on the printed circuit board 200, whereby the printed circuit board 200 no longer heats up so severely overall. The distance saved on the printed circuit board 200 is transferred according to the invention to the punched grid 100, which displays an improved current carrying capacity as a result of enlarged material cross-sections and likewise no longer heats up so severely according to the invention.

Preferably, the punched grid 100 according to the invention is designed accordingly for relays and/or solder contacts, i.e. openings are only formed in the area of the pin contacts 350 of the relays and/or the solder contacts. This is not absolutely essential for other electrical components 300, 310. For instance, the punched-grid 100 may be completely removed, for example, in the area of electrical resistors (see FIG. 4).

It is now possible, according to the invention, due to the improved current carrying capacity of the punched grid 100, improved handling of the overall more rigid punched grid 100 and protection of the punched grid pins 120 in the punched grid 100, for the punched grid 100 to be made thinner overall and thus to be produced more cheaply.

It is thus possible according to the invention to make the punched grid 100 thinner than the conventional 0.8 mm. Taking into consideration conventional electrical contacting of the punched grid 100 by means of a tab, thicknesses of 0.4 mm or 0.32 mm are preferred.

Figure 8:
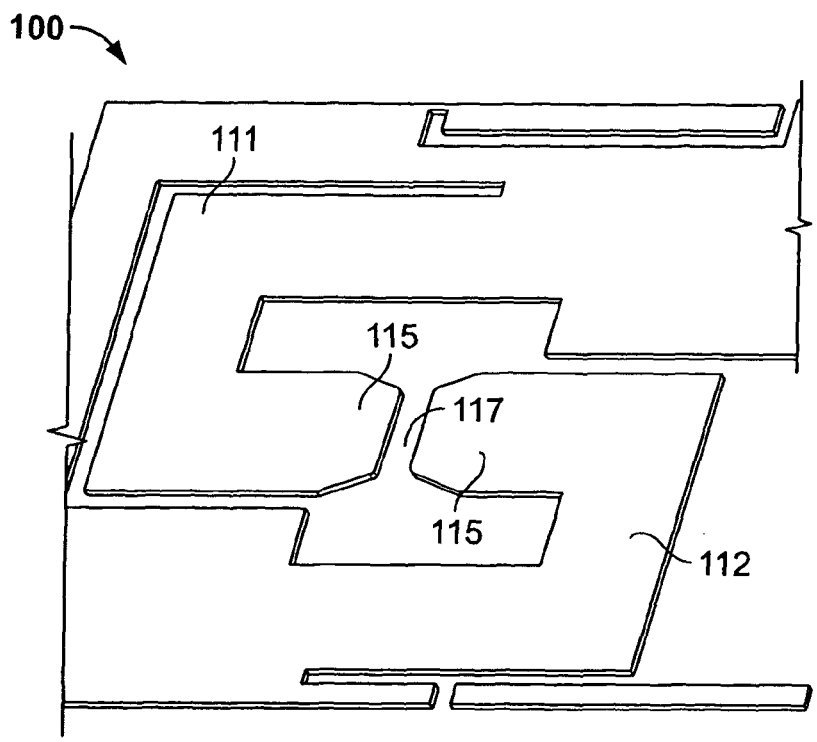
FIG. 8 shows the current infeed of the punched grid according to the invention in plan view.
Figure 9:
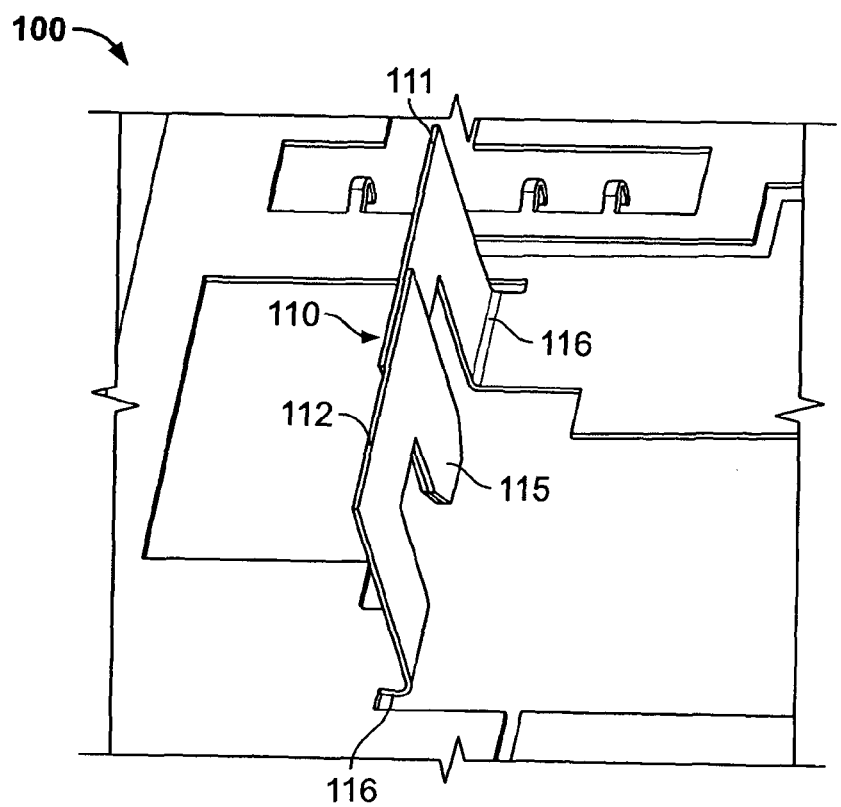
FIG. 9 shows the current infeed of FIG. 8 bent-up and ready for use.
Figure 10:
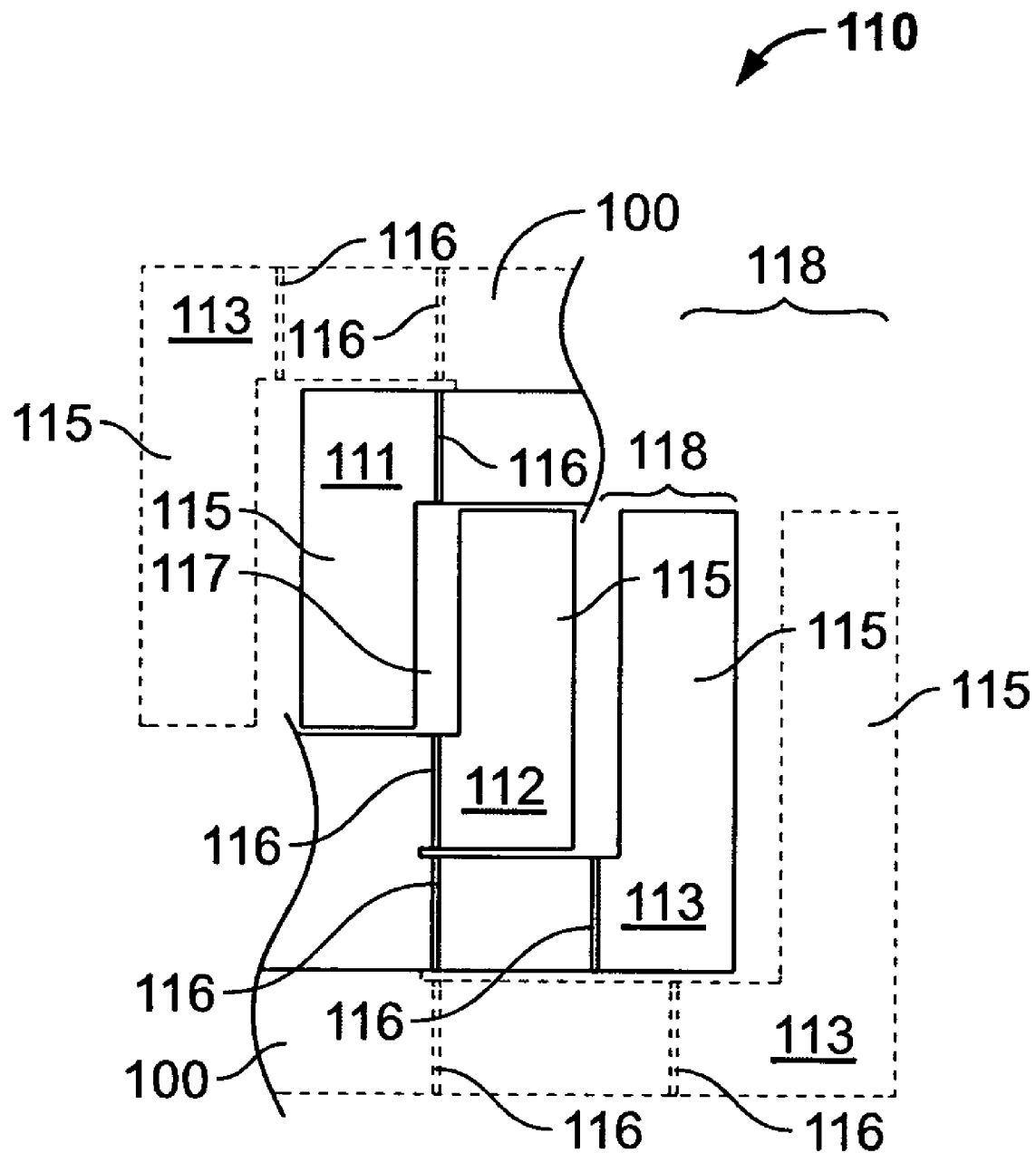
FIG. 10 shows additional embodiments of the current infeed according to the invention.

According to the invention, another current infeed 110 is provided in the or on the punched grid 100. This current infeed 110 is more clearly visible in plan view in FIG. 5 and standing up in FIG. 7. In addition, FIGS. 8 and 9 are somewhat more detailed representations of the current infeed 110 according to the invention, likewise in plan view and standing up respectively. FIG. 10 shows a second variant of the current infeed 110 according to the invention.

The first variant of the current infeed comprises two tongues 111, 112, which are each provided on the or in the punched grid 100 so as to be pivotable or bendable in one direction. The respective tongue 111, 112 is U-shaped in plan view; however, it may exhibit any other desired shape. In addition to U-shaped tongues 111, 112, L-shaped or rectangular tongues 111, 112 are also preferred (see also in this respect FIG. 10).

Figure 5:
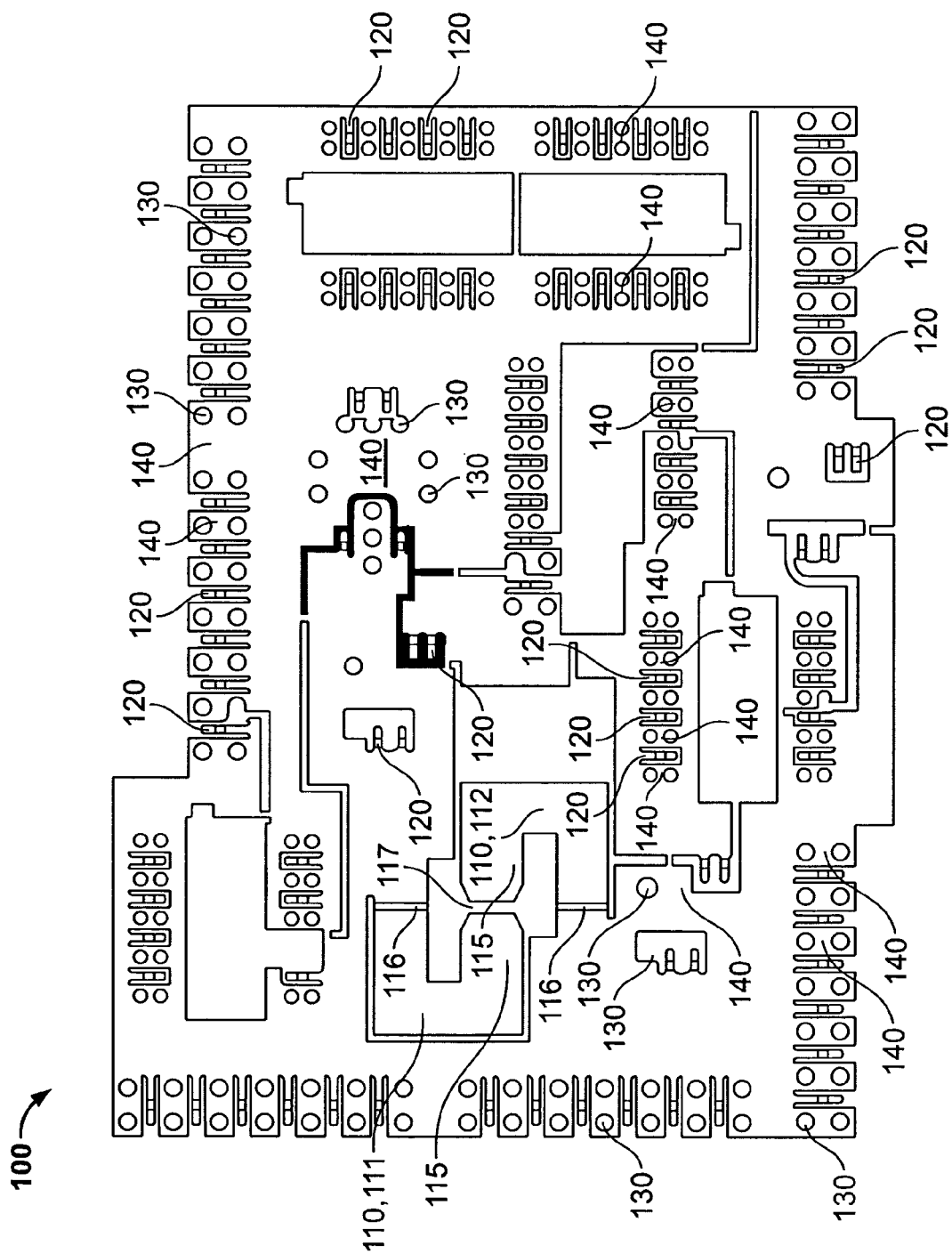
FIG. 5 shows a complete plan view of the punched grid according to the invention.

According to FIGS. 5 and 8, after punching of the punched grid 100 the two U-shaped tongues 111, 112 are arranged facing one another. However, only two branches of the two tongues 111, 112 face one another, while the other branches of the respective tongue 111, 112 are integral with the punched grid 100 and are arranged remote from one another in a plane of the punched grid 100. The mutually facing branches of the tongues 111, 112 are arranged in such a way in the punched grid 100 that these two branches may be brought into a position where they coincide with one another on bending of the respective tongues 111, 112, wherein a common portion 115 common to the two tongues 111, 112 is formed. This is clearly visible in FIGS. 7 and 9. Preferably, the mutually facing branches of the tongues 111, 112, are then in line; the other branches are arranged parallel to one another.

In the area of the common portion 115 of the two tongues 111, 112, the thickness of the current infeed 110 amounts to twice the thickness of the punched grid 100, whereby, in the case of the 0.4 mm thick punched grid 100 for example, the current infeed 110 may be electrically contacted by the conventional tab which is designed for a 0.8 mm thick punched grid 100. For example, should the tab suitable for a 0.8 mm thick punched grid 100 be used, it is also possible to fold three tongues around 0.27 mm thick against one another. Such an embodiment may be achieved, for example, by the three inner tongues 111, 112, 113 in FIG. 10 (see below).

It is of course also possible to use the current infeed 110 according to the invention with the punched grid 100 with the thickness of 0.8 mm, wherein the tab for contacting the current infeed 110 then has to exhibit a corresponding internal dimension of 1.6 mm. In addition, any desired combinations of the tabs and the common portions 115 foldable against one another are of course possible, provided that the common portion 115 of the tongues 111, 112, (113) matches the corresponding internal tab dimension.

In one preferred embodiment of the invention, the two tongues 111, 112 are bent towards one another at a 90 degree angle, resulting in the common portion 115. However, it is also possible for one of the tongues 111, 112 to be bent somewhat further and the other tongue 112, 111 not to be bent so far, such that the overall current infeed 110 adopts an angle with the punched grid 100 other than 90 degrees. However, care should be taken to bend the tongue 111, 112 which is bent by more than 90 degrees carefully, since damage, e.g. material fractures, may occur at a fold joint 116 between the tongue 111, 112 and the punched grid 100. It is therefore preferable for both the tongues 111, 112 to be bent towards one another at a 90 degree angle.

The fold joints 116 of the tongues 111, 112 are located centrally relative to an opening 117, which is formed by the branches of the U-shaped tongues 111, 112 lying directly opposite one another.

FIG. 10 shows further embodiments according to the invention of the current infeed 110 according to the invention. Here the tongues 111, 112, 113 are preferably of substantially rectangular or L-shaped construction.

One embodiment is formed, for example, of the tongues 111, 112, which lie directly opposite one another in the punched grid 100. The two virtually rectangular tongues 111, 112 are folded up against one another at the respective fold joint 116, as in the above example, and form the common portion 115, which, together with the corner/edge areas of the respective tongue 111, 112, may be gripped over by the tab.

According to the invention, it is then possible in one embodiment to fold a third tongue 113 against the two mutually adjacent tongues 111, 112. To this end, the third tongue 113 is bent upwards at a 90 degree angle at its fold joint 116 roughly in line with the fold joint 116 of the two tongues 111, 112 and then the upper edge of the third tongue 113 is bent downwards at a further fold joint 116 of the third tongue 113 towards the edge located at the bottom relative to the tongues 111, 112. In the process, part of the third tongue 113 is bent at a 180 degree angle, which needs to proceed carefully in view of the thin punched grid 100. The portion 118 to be bent a second time in the case of the third tongue 113 then rests against the common portion 115 of the tongue 112.

It is possible to provide a plurality of such third tongues 113 for the current infeed 110. These additional third tongues 113 may be provided either adjoining only one of the tongues 111, 112 or adjoining both of the tongues 111, 112 in the plan view of the punched grid 100; see in this regard the third tongues 113 illustrated in faint lines in FIG. 10.

By extending a free end of the third tongue 113 it is possible to support the third tongue 113 in the plane of the punched grid 100. To this end, the "projecting" free end is bent at a 90 degree angle in the direction of the plane of the punched grid 100, whereby the third tongue 113 may additionally rest against the printed circuit board 200.

It is additionally possible to position the third tongue 113 via three 90 degree angles against the common portion 115 of the tongues 111, 112. To this end, the third tongue 113 is raised up straight at a 90 degree angle with a first fold joint 116, with a second fold joint 116 it is folded towards the common portion 115 and with a third fold joint 116 the remaining free end portion is positioned against the existing common portion 115 of the tongues 111, 112.

The invention claimed is:

1. An electrical power distribution unit for an electrical system, comprising:
a printed circuit board, a punched grid arranged on the printed circuit board, and an electrical component, which is arranged on the printed circuit board on a side of the punched grid,
an electrical contact of the electrical component projecting through a passage opening in the printed circuit board,
wherein the punched grid is arranged between the electrical component and the printed circuit board, and an opening is formed in the punched grid in an area around the electrical contact of the electrical component;
wherein a current infeed of the punched grid comprises at least two tongues projecting out of a plane of the punched grid, which rest against one another in electrical contact at a common portion.

2. The electrical power distribution unit according to claim 1, wherein punched grid pins are provided in the immediate vicinity, separated by a gap which is narrow in comparison with the dimensions of the punched grid, of the portions in the punched grid which are provided between the printed circuit board and the electrical component.

3. The electrical power distribution unit according to claim 1, wherein the punched grid pins for supplying current to the printed circuit board are provided between the printed circuit board and the electrical component or directly adjacent an outer boundary of the electrical component.

4. The electrical power distribution unit according to claim 1, wherein the portion of the punched grid located between the electrical component and the printed circuit board extends through and under the electrical component.

5. The electrical power distribution unit according to claim 1, wherein the portion of the punched grid located between the electrical component and the printed circuit board extends through and under the electrical component between two substantially parallel sides of the electrical component.

6. The electrical power distribution unit according to claim 1, wherein the area of the punched grid removed for the electrical contact is located wholly between the electrical component and the printed circuit board.

7. The electrical power distribution unit according to claim 1, wherein the electrical component is seated on the portion of the punched grid located between it and the printed circuit board.

8. The electrical power distribution unit according to claim 1, wherein a tongue is substantially rectangular, L- or U shaped in plan view, and when bent out, the tongue projects at approximately a 90° angle from the punched grid.

9. The electrical power distribution unit according to claim 8, wherein a portion of at least one tongue of the current infeed may additionally be bent at least one further time in such a way that this tongue forms a common, mutually adjacent portion with another tongue.

10. The electrical power distribution unit according to claim 9, wherein the portion bendable a second time may be bent at approximately a 180° angle, in order to form a common portion with a tongue.

11. The electrical power distribution unit according to claim 1, wherein the current infeed comprises just two tongues bendable against one another, which are substantially U-shaped in plan view and, when bent against one another, the common portion of the two tongues is formed substantially of one branch of the U-shaped tongues.

12. The electrical power distribution unit according to claim 1, wherein the mutually adjacent portions of the tongues together produce a thickness which corresponds to an internal dimension of a tab of the electrical current infeed of the punched grid.

13. The electrical power distribution unit according to claim 1, wherein fold joints of the tongues are located centrally relative to an opening formed by the branches of the tongues lying directly opposite one another.

14. The electrical power distribution unit according to claim 1, wherein the punched grid comprises openings, the respective dimensions of which are such that only electrical contacts of an electrical component may be inserted through the openings.

15. The electrical power distribution unit according to claim 1, wherein the punched grid has a thickness of less than 0.8 mm.

* * * * *